(12) United States Patent
Kimura et al.

(10) Patent No.: US 7,940,031 B2
(45) Date of Patent: May 10, 2011

(54) SWITCHING POWER SUPPLY CIRCUITRY

(75) Inventors: Kazuhito Kimura, Kyoto (JP); Takuya Ishii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/662,828

(22) Filed: May 5, 2010

(65) Prior Publication Data

US 2010/0277147 A1    Nov. 4, 2010

Related U.S. Application Data

(63) Continuation of application No. 11/705,013, filed on Feb. 12, 2007, now Pat. No. 7,714,546.

(30) Foreign Application Priority Data

Mar. 8, 2006  (JP) .................................. 2006-061945
Dec. 11, 2006  (JP) .................................. 2006-332713

(51) Int. Cl.
    *G05F 1/00*    (2006.01)
(52) U.S. Cl. ......................... 323/222; 323/266; 323/224
(58) Field of Classification Search .................. 323/222, 323/266, 224, 288
    See application file for complete search history.

(56) References Cited

U.S. PATENT DOCUMENTS

| 5,247,239 | A | 9/1993 | Yamamurai et al. | |
|---|---|---|---|---|
| 6,903,535 | B2 | 6/2005 | Liu et al. | |
| 6,972,547 | B2 * | 12/2005 | Murakami | 323/267 |
| 7,098,633 | B1 * | 8/2006 | Brokaw et al. | 323/222 |
| 7,688,052 | B2 * | 3/2010 | Rozsypal et al. | 323/282 |
| 7,714,546 | B2 * | 5/2010 | Kimura et al. | 323/222 |
| 7,786,712 | B2 * | 8/2010 | Williams | 323/266 |

FOREIGN PATENT DOCUMENTS

JP          2005312191 A    11/2005

* cited by examiner

*Primary Examiner* — Shawn Riley
(74) *Attorney, Agent, or Firm* — Steptoe & Johnson LLP

(57) ABSTRACT

An output voltage VC obtained by boosting an input voltage VIN by means of a charge pump control circuit 3 of a charge pump 102 is supplied as a power supply voltage to a control circuit 4 of a step-up converter. It is thus possible to eliminate the need for a conventional self-bias method, eliminate switching from startup oscillation to main oscillation of the conventional self-bias method upon startup, and overcome problems caused by the switching of oscillation states, thereby achieving switching power supply circuitry starting in a reliable and stable manner.

12 Claims, 10 Drawing Sheets

SWITCHING POWER SUPPLY CIRCUITRY

REFERENCE TO RELATED APPLICATIONS

This application is a continuation of application Ser. No. 11/705,013 filed Feb. 12, 2007, which claims the benefit of Japanese Patent Application No. 2006-061945 filed Mar. 8, 2006 and Japanese Patent Application No. 2006-332713 filed Dec. 11, 2006.

FIELD OF THE INVENTION

The present invention relates to switching power supply circuitry used as a power supply source of battery-driven equipment using, for example, a dry cell.

BACKGROUND OF THE INVENTION

Conventionally, switching power supply circuitry with a light weight, a small size, and high power efficiency is widely used for battery-driven equipment that uses a DC battery such as a dry cell as a power supply source and includes a portable terminal such as a mobile phone and a notebook computer.

Particularly in recent years, as the number of battery-driven equipment such as electronic equipment increases, a low-voltage operation and a long-lasting operation of equipment, that is, long-life batteries are growing in demand for power supply circuitry, including this kind of switching power supply circuitry.

FIG. 11 shows a conventional example described in Japanese Patent Laid-Open No. 2005-312191 and so on. In this switching power supply circuitry, an input voltage VIN applied to an input terminal T1 is outputted as an output voltage VOUT to an output terminal T2 through a DC-DC converter 100.

In the DC-DC converter 100, a step-up converter is made up of a choke coil 5, a main switch 6 including an N-channel MOS transistor, a rectifier diode 7, a rectifier switch 8, and an output smoothing capacitor 9. The output of the rectifier diode 7 and the rectifier switch 8 is smoothed by the output smoothing capacitor 9 and supplied to a load 10 connected to the output terminal T2.

A ring oscillation circuit 11 is supplied with power from the input terminal T1 and determines an on/off period when the main switch 6 and the rectifier switch 8 are started through a driving circuit 15.

A PWM control circuit 12 is supplied with power from the output terminal T2 and determines the on/off period of the main switch 6 and the rectifier switch 8 in order to control the output voltage VOUT through a switch 14 and the driving circuit 15.

A switching control circuit 13 switches the switch 14 so as to select a driving signal from the ring oscillation circuit 11 upon startup and select a driving signal from the PWM control circuit 12 in a steady state. The driving circuit 15 drives the main switch 6 and the rectifier switch 8 in response to the driving signal selected by the switch 14.

The switching power supply circuitry is started by applying a voltage not lower than a predetermined voltage to the input terminal T1. When the input voltage VIN is low, to be specific, when an AA battery is connected to the input terminal T1 to operate the switching power supply circuitry, it is necessary to operate the circuitry with an extremely low input voltage of about 1 V.

The gate of a CMOS structure has a threshold voltage of nearly 1 V and thus there is little margin from the input voltage VIN of about 1 V. Particularly regarding a circuit like the PWM control circuit 12 requiring the function of adjusting the on/off time of the driving signal in response to an output feedback signal, simplification for a low power supply voltage operation is limited, making it difficult to design the circuit. In other words, it is difficult to perform temperature compensation for a circuit operation and reduce variations in characteristics, making it difficult to stably control the circuit operation. In the switching power supply circuitry of FIG. 11, the main switch 6 and the rectifier switch 8 are turned on/off upon startup in response to the driving signal from the ring oscillation circuit 11 supplied with power from the input voltage VIN, and the voltage is increased without feedback control on the output voltage VOUT.

In the ring oscillation circuit 11, inverters of multiple stages are connected like a ring, so that the ring oscillation circuit 11 can be operated with a low power supply voltage. In a CMOS structure, it is only necessary to have a power supply voltage slightly higher than the gate threshold voltage. In other words, an oscillation can be obtained by a power supply voltage of no more than 1 V.

To be specific, it is detected that the output voltage VOUT is low and the switching control circuit 13 starts operating, and the switching control circuit 13 switches the switch 14 to select the driving signal from the ring oscillation circuit 11. In response to the on/off operation of the main switch 6 and the rectifier switch 8, power is transmitted from the input voltage VIN to the output voltage VOUT through the choke coil 5 and thus the output voltage VOUT increases. At this point, the switching power supply circuitry does not perform a feedback operation for controlling the output. In this way, a non-feedback boosting operation (hereinafter, will be referred to as "startup oscillation") is performed by ring oscillation.

When the potential of the output voltage VOUT reaches a predetermined potential set by the switching control circuit 13, the switching control circuit 13 switches the switch 14 so as to select the driving signal from the PWM control circuit 12. Thus the operation of the switching power supply circuitry shown in FIG. 11 switches from "startup oscillation" to a feedback switching operation (hereinafter, will be referred to as "main oscillation") using the PWM control circuit 12 supplied with power from the boosted output voltage VOUT. In the main oscillation, the switching power supply circuitry operates such that the output voltage VOUT reaches a target voltage.

FIG. 12 shows another conventional switching power supply circuitry.

The switching power supply circuitry is multi-channel control switching power supply circuitry in which an input voltage VIN applied to an input terminal T1 passes through a DC-DC converter 100 to output a plurality of output voltages VOUT1, VOUT2, VOUT3, . . . from output terminals T2, T3, T4, . . . . The switching power supply circuitry includes a circuit for outputting the output voltage VOUT1 (hereinafter, will be abbreviated to CH1), a circuit for outputting the output voltage VOUT2 (hereinafter, will be abbreviated to CH2), and a circuit for outputting the output voltage VOUT3 (hereinafter, will be abbreviated to CH3).

The basic configuration and operation of CH1 are similar to those of the switching power supply circuitry of FIG. 11 and thus the explanation thereof is omitted. CH2 is made up of a CH2 control circuit 16 and a step-down converter including a main switch 17, a rectifier diode 18, a choke coil 19, and an output smoothing capacitor 20. CH3 is made up of a CH3 control circuit 21 and a step-up converter including a choke coil 22, a main switch 23, a rectifier diode 24, and an output smoothing capacitor 25.

The switching power supply circuitry of FIG. 12 is also started by applying a voltage not lower than a predetermined voltage to the input terminal T1. As described in the switching power supply circuitry of FIG. 11, the CH2 control circuit 16 and the CH3 control circuit 21 are self-biased so as to be supplied with power from the output voltage VOUT1 of CH1, on fear that the control circuit becomes unstable when the input voltage VIN is low.

For this reason, on the channels (for example, CH2 and CH3) other than CH1, switching power supply control is started when the power supply voltage of each control circuit reaches a potential enabling a stable operation, that is, after CH1 changes from startup oscillation to main oscillation.

DISCLOSURE OF THE INVENTION

However, in the switching power supply circuitry of FIG. 11, for example, during setting with the input voltage VIN of 2 V and the output voltage VOUT of 5 V, in the case where the switching control circuit 13 switches from "startup oscillation" to "main oscillation" when the output voltage VOUT increases to 2.5 V, the following problems may occur:

(1) Immediately after switching from "startup oscillation" to "main oscillation", when the driving pulse from the PWM control circuit 12 to the main switch 6 has a long pulse width (in other words, the on time of the main switch 6 is long), excessive power is accumulated in the choke coil 5 during the on period of the main switch 6. Thus overshoot occurs on the output voltage VOUT and the load 10 (for example, a microcomputer) may deteriorate or break in the worst case. Further, excessive rush current is generated on the input and degrades the performance of the battery used for the power supply.

(2) Immediately after switching from "startup oscillation" to "main oscillation", when the driving pulse from the PWM control circuit 12 to the main switch 6 has a short pulse width, the main switch 6 is turned off over the period and the rectifier switch 8 is turned on over the period with the shortest pulse width. Thus the input voltage VIN and the output voltage VOUT are short-circuited through the choke coil 5 and the rectifier switch 8. For this reason, power (current) accumulated during "startup oscillation" flows back from the output to the power supply, reducing the output voltage VOUT. When the potential of the reduced output voltage VOUT falls below the predetermined value, the switching control circuit 13 recognizes a startup state again and returns to "startup oscillation". In this way, a startup failure with repeated "startup oscillation" and "main oscillation" may occur.

Further, in the switching power supply circuitry of FIG. 12, the power supply voltage is the output voltage VOUT1 of CH1 in the control circuits of channels other than CH1. Thus the circuits cannot start until the output voltage VOUT1 of CH1 increases to a potential enabling the control circuits of the other channels to stably operate. The order of start is restricted such that self-biased CH1 has to always start first.

The present invention is designed to solve the conventional problems and has as its object the provision of switching power supply circuitry which can prevent the conventional problems caused by switching from "startup oscillation" to "main oscillation" and can positively start in a multi-channel configuration without being restricted by the order of start.

In order to solve the problems, the switching power supply circuitry of the present invention includes a step-up converter for switching a DC input voltage by means of a switch element to obtain a DC output voltage boosted from the input voltage, a step-up power supply for a control circuit, also referred to herein as a charge pump, the step-up power supply or charge pump boosting the input voltage and outputting the voltage, and a control circuit supplied with power from the output voltage of the step-up power supply or charge pump for a control circuit, the control circuit controlling the switch element of the step-up converter when the output voltage of the step-up power supply or charge pump for a control circuit is not lower than a predetermined operation start voltage.

With this configuration, the control circuit of the step-up converter can be sufficiently supplied with power even when the input voltage is low, so that the power supply circuitry can be positively started.

In this case, the step-up power supply for a control circuit may be configured as a charge pump including an oscillation circuit for generating driving pulses of a predetermined frequency, a plurality of switch elements switching in response to the driving pulses, and at least a single jumping capacitor charged/discharged by the switching of the plurality of switch elements. Further, in the case where the oscillation circuit is a ring oscillation circuit including inverters of multiple stages connected like a ring, the driving pulses can be generated with a low power supply voltage.

Moreover, the step-up power supply for a control circuit may include a stabilizing circuit such as a series regulator for stabilizing the output voltage of the step-up power supply for a control circuit and outputting the voltage. Thus it is possible to achieve a breakdown voltage and a stable operation of the control circuit.

The control circuit may include an error amplifier for generating an error signal of the DC output voltage and a target value and a PWM circuit for generating a driving pulse for controlling the switching operation of the step-up converter in response to the error signal. When the output voltage is not lower than a predetermined value, one of the error amplifier and the PWM circuit may be supplied with power from the DC output voltage instead of the output voltage of the step-up power supply for a control circuit. The control circuit may be, when the output voltage is not lower than the predetermined value, supplied with power from the DC output voltage instead of the output voltage of the step-up power supply for a control circuit. Further, the step-up power supply for a control circuit may stop operating when the output voltage is not lower than the predetermined value. This configuration can reduce power consumption during a normal operation.

By providing a DC-DC converter for obtaining a second output voltage from the input voltage and a second control circuit supplied with power from the output voltage of the step-up power supply for a control circuit, the second control circuit controlling the DC-DC converter when the voltage of the step-up power supply for a control circuit reaches the predetermined operation start voltage, it is possible to positively start the switching power supply circuitry even in a multi-channel configuration without restricting the order of start.

With this configuration, the step-up power supply for a control circuit supplies a power supply voltage enabling the control circuit to stably operate, the step-up power supply operating from a low input voltage. It is thus possible to prevent problems caused by switching from startup oscillation to main oscillation in the conventional self-bias method. Therefore, it is possible to positively start the switching power supply circuitry with stability, suppress input rush current and output overshoot or the like upon startup, reduce excessive power consumption, and increase the life of a battery. Also in a multi-channel configuration, the switching power supply circuitry can be positively started without being restricted by the order of start.

DESCRIPTION OF THE EMBODIMENTS

Referring to FIGS. 1 to 10, embodiments of the present invention will now be described below.

Embodiment 1

Figure 1:
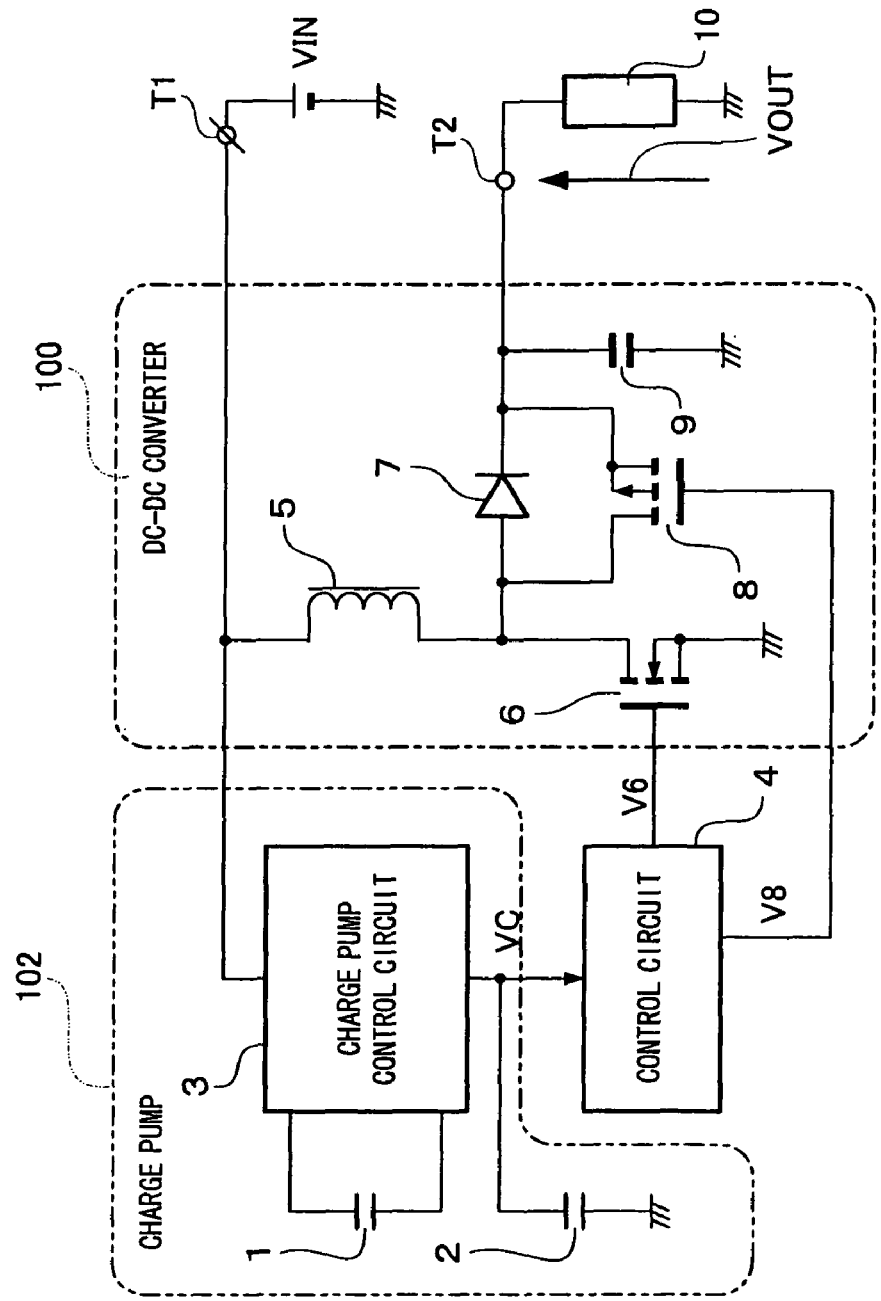
FIG. 1 is a structural diagram of switching power supply circuitry according to Embodiment 1 of the present invention.
Figure 3:
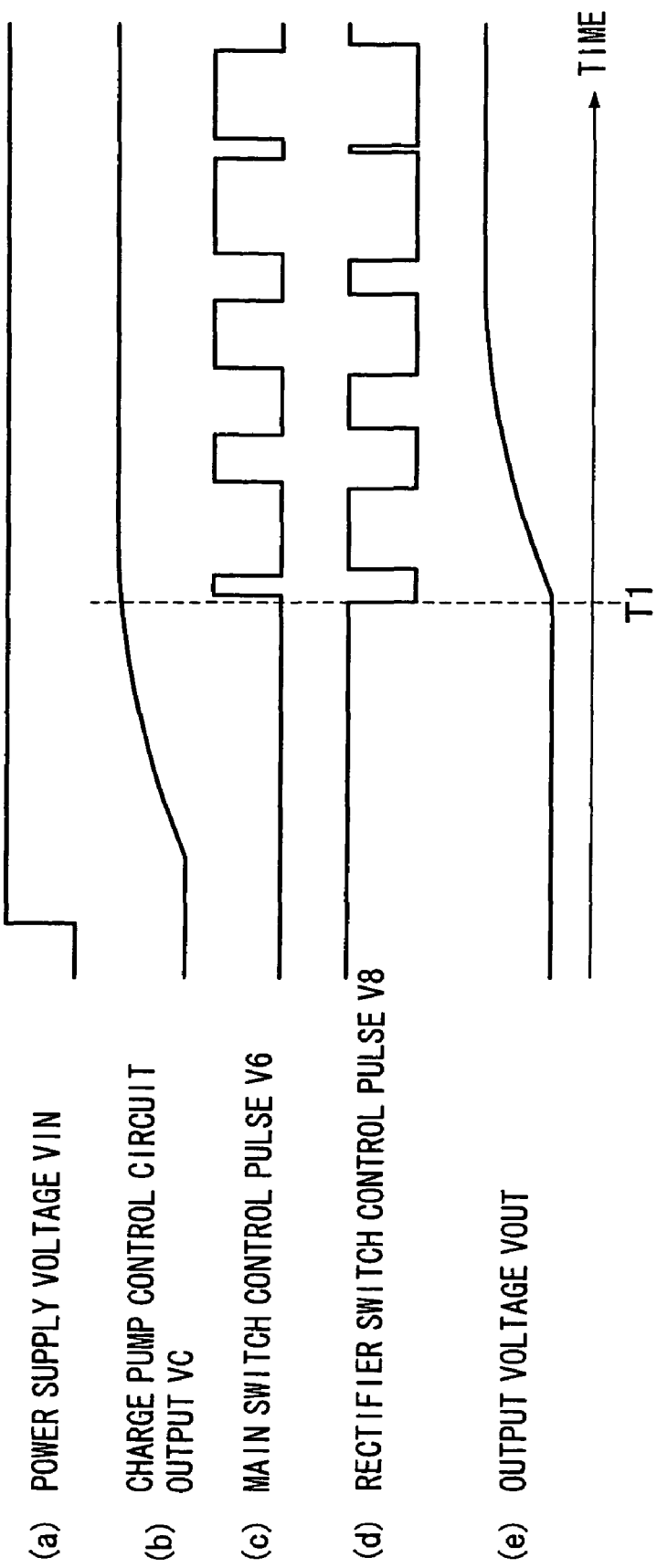
FIG. 3 is a timing chart showing the start operation of FIG. 1.

FIGS. 1 and 3 show switching power supply circuitry according to Embodiment 1 of the present invention.

In the switching power supply circuitry, an input voltage VIN applied to an input terminal T1 is outputted as an output voltage VOUT to an output terminal T2 through a DC-DC converter 100 acting as a step-up converter. In the DC-DC converter 100, a step-up converter is made up of a choke coil 5 having one end connected to the input terminal T1, a main switch 6 including an N-channel MOS transistor, a rectifier diode 7, a rectifier switch 8, and an output smoothing capacitor 9. To be specific, the anode of the rectifier diode 7, the drain of the main switch 6, and the drain of the rectifier switch 8 are connected to the other end of the choke coil 5 and the source of the main switch 6 is grounded. The output of the rectifier diode 7 and the rectifier switch 8 is smoothed by the output smoothing capacitor 9 and supply to a load 10 connected to the output terminal T2.

The switching power supply circuitry further includes a charge pump 102 supplied with power from the input terminal T1 and a control circuit 4 operated by power supplied as an output voltage VC from the charge pump 102.

The charge pump 102 acts as a step-up power supply for a control circuit for boosting and outputting input voltage. The charge pump 102 is made up of a charge pump control circuit 3, a jumping capacitance 1 for the charge pump, and an output smoothing capacitance 2 for the charge pump. According to the output voltage VC based on the input voltage VIN of the charge pump 102, the control circuit 4 outputs control pulses V6 and V8 for controlling the gates of the main switch 6 and the rectifier switch 8.

Referring to FIGS. 1 and 3, the starting operation of the switching power supply circuitry configured thus will be described below.

FIG. 3 is a timing chart showing the starting operation of the switching power supply circuitry of the present embodiment. The switching power supply circuitry is started by supplying the input voltage VIN of FIG. 3(A).

In the conventional configuration, the circuit configuration is restricted by a low voltage supplied from an AA battery and it is difficult to perform temperature compensation and reduce variations in characteristics, making it difficult to stably control the circuit operation, whereas the switching power supply circuitry of the present embodiment can achieve a circuit operation even with a low power supply voltage as will be described below:

At the start of the input voltage VIN, the charge pump control circuit 3 operating using the input voltage VIN as a control bias is first operated and started, and the output voltage VC of the charge pump control circuit 3 is monitored by the control circuit 4 as shown FIG. 3(B). When it is recognized that the voltage enables a stable operation, the control circuit 4 generates, as shown in FIGS. 3(C) and 3(D), the control pulses V6 and V8 for the gates of the main switch 6 and the rectifier switch 8 at control time T1 obtained according to the value of bias voltage inputted as the output voltage VC, the control circuit 4 starts the control of a switching power supply for the main switch 6 and the rectifier switch 8, and the output voltage VOUT is outputted as shown in FIG. 3(E).

Embodiment 2

Figure 2:
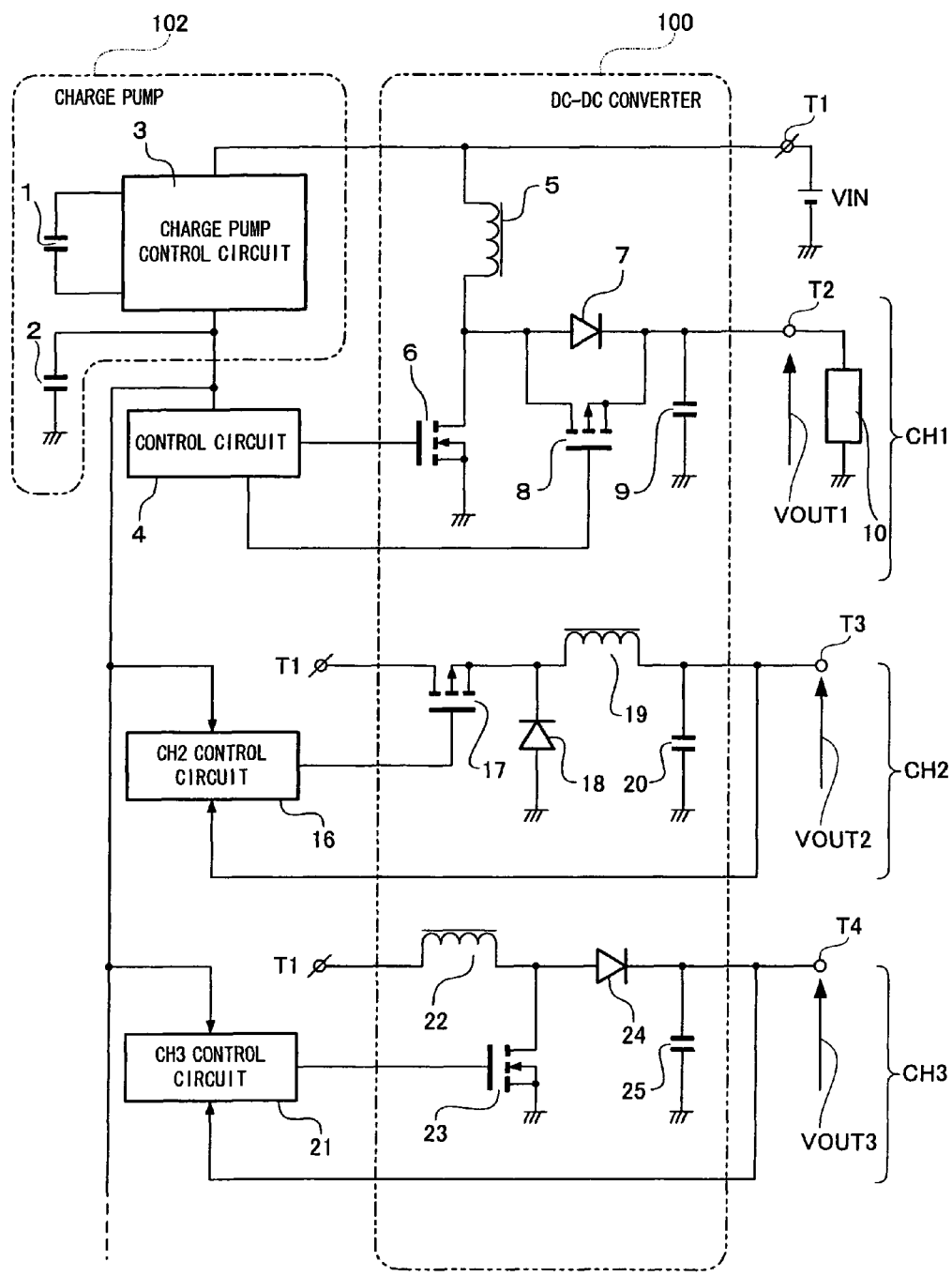
FIG. 2 is a-structural diagram of switching power supply circuitry according to Embodiment 2 of the present invention.

FIG. 2 shows switching power supply circuitry according to Embodiment 2 of the present invention.

Figure 12:
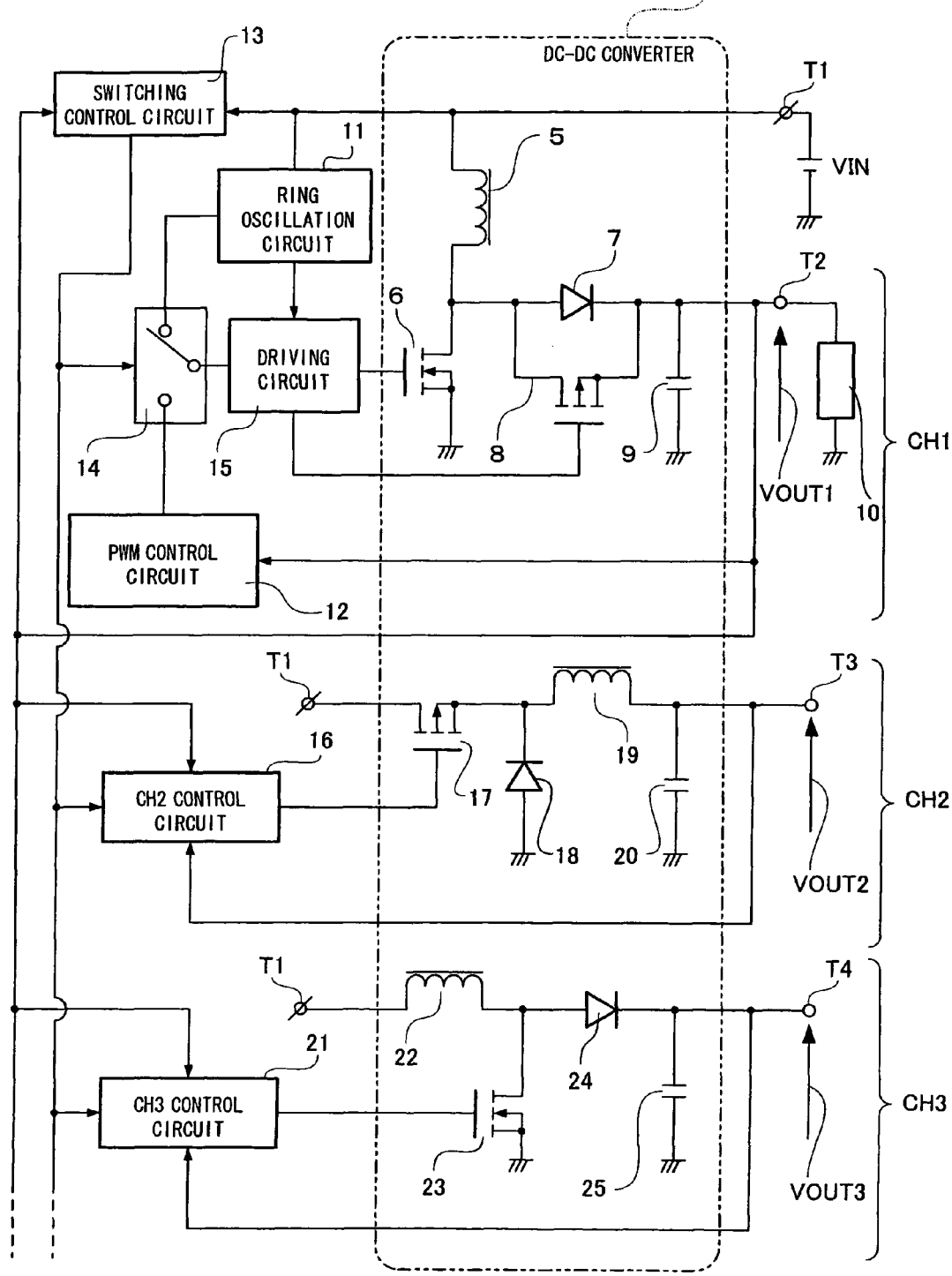
FIG. 12 is a structural diagram of another conventional switching power supply circuitry.

The switching power supply circuitry is a switching power supply system for performing multi-channel control. A charge pump 102 and a control circuit 4 for an output voltage VOUT1 of a DC-DC converter 100 are similar to those of Embodiment 1. Further, the configurations of CH2, CH3, . . . are similar to those of FIG. 12 and thus the operations thereof are also similar to those of FIG. 12. For this reason, the detailed explanation thereof is omitted.

In the multi-channel control of the switching power supply circuitry shown in FIG. 2, the same operations as Embodiment 1 are performed from the supply of an input voltage VIN to the start of a charge pump control circuit 3.

As in Embodiment 1, a voltage boosted to a given potential by the charge pump control circuit 3 is monitored by the control circuit of each CH (for example, the control circuit 4, a CH2 control circuit 16, and a CH3 control circuit 21). When each control circuit recognizes that the voltage enables a stable operation, switching power supply control is started by each control circuit and each output voltage (for example, output voltages VOUT1, VOUT2, VOUT3) is increased to a desired voltage necessary for equipment to perform stable control.

As described above, according to the switching power supply circuitry of the present embodiment, the boosted output of a given voltage is supplied as the bias voltage of the control circuit to eliminate the need for the conventional self-bias method in the switching power supply system, the output being obtained by the charge pump control circuit of the charge pump based on the voltage of the input power supply. Thus it is possible to eliminate switching from startup oscillation to main oscillation upon startup in the conventional circuitry. It is therefore possible to eliminate a startup failure caused by the switching of oscillation states and remove restrictions on the order of start in the multi-channel configuration.

As a result, in the switching power supply system, stable startup can be positively obtained even with a low input voltage. Further, it is possible to reduce excessive power consumption by suppressing input rush current and output overshoot or the like upon startup, increase the life of a battery, achieve a stable operation at a low voltage, and achieve a multi-channel system configuration without restrictions on the order of start.

Embodiment 3

Figure 4:
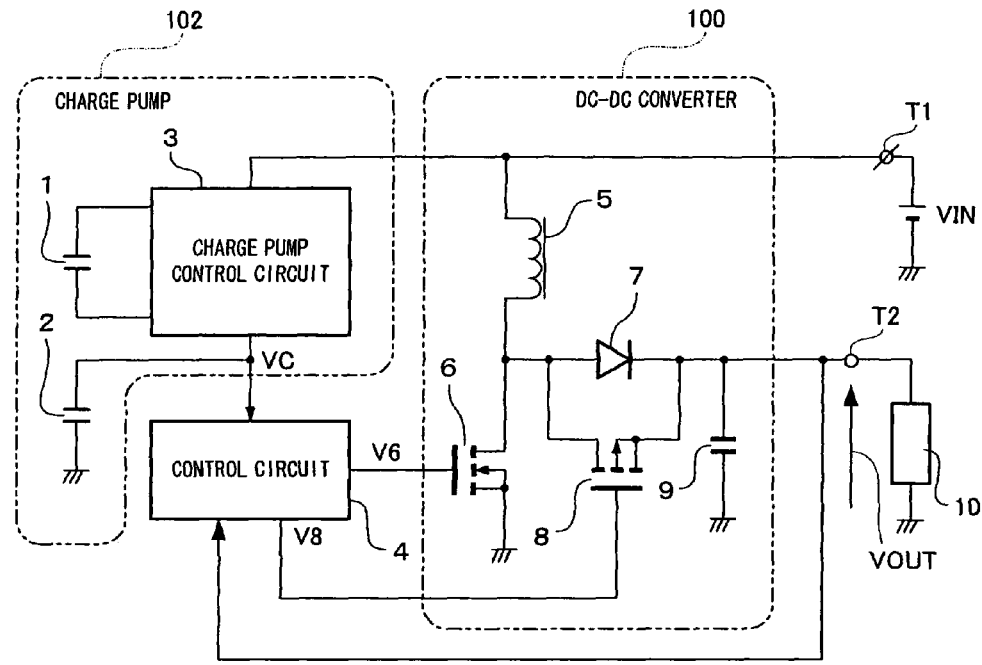
FIG. 4 is a circuit block diagram of switching power supply circuitry according to Embodiment 3 of the present invention.
Figure 5:
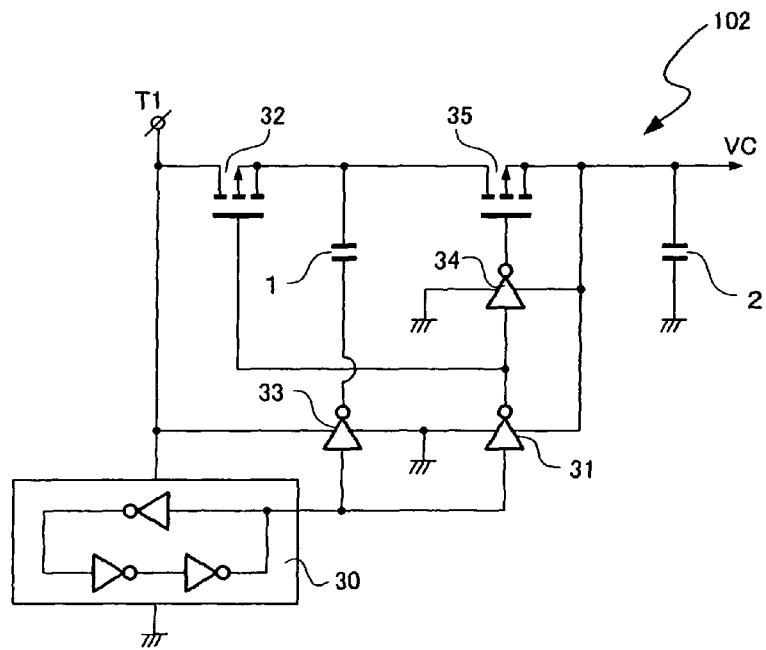
FIG. 5 is a structural diagram showing a charge pump of Embodiment 3.
Figure 6:
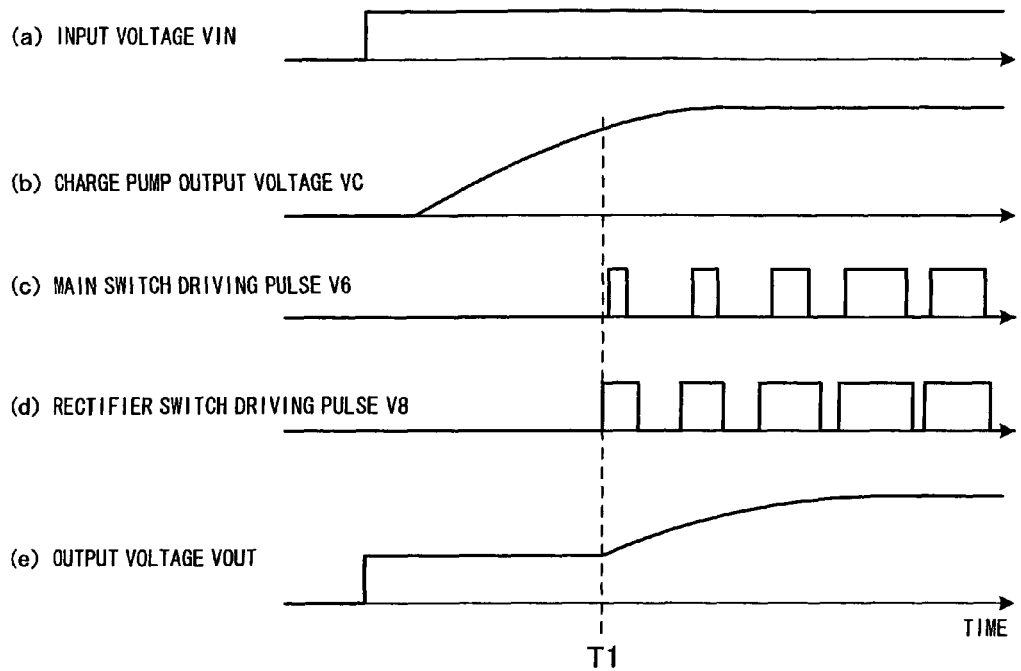
FIG. 6 is a timing chart showing the startup of Embodiment 3.

FIGS. 4 to 6 show switching power supply circuitry according to Embodiment 3 of the present invention.

In the switching power supply circuitry of Embodiment 3 shown in FIG. 4, an input voltage VIN applied to an input terminal T1 is outputted as an output voltage VOUT to an output terminal T2 through a DC-DC converter 100.

In the DC-DC converter 100, a step-up converter is made up of a choke coil 5 having one end connected to the input terminal T1, a main switch 6 including an N-channel MOS transistor, a rectifier diode 7, a rectifier switch 8, and an output smoothing capacitor 9. To be specific, the anode of the rectifier diode 7, the drain of the main switch 6, and the drain of the rectifier switch 8 are connected to the other end of the choke coil 5 and the source of the main switch 6 is grounded. The output of the rectifier diode 7 and the rectifier switch 8 is smoothed by the output smoothing capacitor 9 and supplied to a load 10 connected to the output terminal T2.

The switching power supply circuitry of Embodiment 3 further includes a charge pump 102 supplied power from the input terminal T1 and a control circuit 4 operated by power supplied as an output voltage VC from the charge pump 102. The control circuit 4 outputs driving pulses V6 and V8 to the gates of the main switch 6 and the rectifier switch 8 such that the output voltage VOUT comes close to a target value.

The charge pump 102 is made up of a jumping capacitor 1, an output smoothing capacitor 2, and a charge pump control circuit 3 supplied with the input voltage VIN. FIG. 5 shows a specific configuration of the charge pump 102.

The charge pump control circuit 3 of the charge pump 102 is made up of a ring oscillation circuit 30, an inverter 31 for inverting the output of the ring oscillation circuit 30 by using the output voltage VC of the charge pump 102 as a power supply voltage, a first switch 32 which is supplied with the input voltage VIN from the input terminal T1 and includes a PMOS transistor driven by the inverter 31, an inverter 33 for inverting the output of the ring oscillation circuit 30 by using the input voltage VIN from the input terminal T1 as a power supply voltage, an inverter 34 for inverting the output of the inverter 31 by using the output voltage VC of the charge pump 102 as a power supply voltage, and a second switch 35 which is connected between the source of the first switch 32 and the output smoothing capacitor 2 and includes a PMOS transistor driven by the output of the inverter 34. The jumping capacitor 1 is connected between the source of the first switch 32 and the output of the inverter 33.

FIG. 6 is a timing chart showing the starting operation of the switching power supply circuitry of Embodiment 3. FIG. 6(A) shows the input voltage VIN, FIG. 6(B) shows the output voltage VC of the charge pump 102, FIG. 6(C) shows the driving pulse V6 to the main switch 6, FIG. 6(D) shows the driving pulse V8 to the rectifier switch 8, and FIG. 6(E) shows the output voltage VOUT.

Referring to FIGS. 4 to 6, operations upon startup of Embodiment 3 will be described below.

The switching power supply circuitry of Embodiment 3 is started by applying the input voltage VIN not lower than a predetermined voltage. In FIG. 5, the ring oscillation circuit 30 of the charge pump control circuit 3 operates using the input voltage VIN as a power supply voltage and includes inverters of multiple stages connected like a ring. The ring oscillation circuit 30 can operate with a low power supply voltage. In a CMOS structure, it is only necessary to have a power supply voltage slightly higher than the gate threshold voltage. In other words, an oscillation can be obtained by a power supply voltage of no more than 1 V. The output of the ring oscillation circuit 30 turns on/off the first switch 32 via the inverter 31 and turns on/off the second switch 35 via the inverter 34. Therefore, the first switch 32 and the second switch 35 are alternately turned on/off. When the first switch 32 is turned on, the output of the inverter 33 reaches the ground potential and thus the jumping capacitor 1 is charged from the input voltage VIN. Next, when the first switch 32 is turned off, the output of the inverter 33 reaches the input voltage VIN. Thus the output smoothing capacitor 2 is charged with a voltage equal to the sum of the voltage of the jumping capacitor 1 and the input voltage VIN through the turned-on second switch 35. By repeating this operation, a voltage nearly twice the input voltage VIN is outputted from the output smoothing capacitor 2 as the output voltage VC of the charge pump 102.

In this configuration, the power supply voltage of the inverter 33 is the input voltage VIN because the input voltage VIN is outputted from the inverter 33 to increase the voltage of the jumping capacitor 1 to the input voltage VIN. Further, the power supply voltage of the inverter 31 and the inverter 34 is the output voltage VC of the charge pump 102 because the gate potentials of the first switch 32 and the second switch 35 serving as PMOS transistors are pulled up to the output voltage VC of the charge pump 102 to positively turn off the switches. The output voltage VC is higher than the input voltage VIN.

When the output voltage VC is increased thus by the operation of the charge pump 102 and a power supply voltage at time T1 of FIG. 6 enables the control circuit 4 to stably operate, the control circuit 4 starts operating. In other words, the driving pulses V6 and V8 are outputted to the main switch 6 and the rectifier switch 8 such that the output voltage VOUT comes close to a target value.

The main switch 6 and the rectifier switch 8 are alternately turned on/off by the driving pulses from the control circuit 4. When the main switch 6 is turned on, the input voltage VIN is applied to the choke coil 5. Thus current passes through the choke coil 5 and energy is accumulated therein. Next, when the main switch 6 is turned off, the current of the choke coil 5 is applied so as to charge the output smoothing capacitor 9 through the rectifier switch 8. The output voltage VOUT is increased by repeating this operation. During a stable operation, the output voltage VOUT can be controlled according to the on time of the main switch 6 and the control circuit 4 adjusts the pulse widths of the driving pulses V6 and V8 to the main switch 6 and the rectifier switch 8 such that the output voltage VOUT reaches a target value.

In the timing chart of FIG. 6, the pulse width (on time) of the driving pulse V6 of the main switch 6 and the pulse width (off time) of the driving pulse V8 of the rectifier switch 8 are gradually increased from the start of the operation, which is soft start for suppressing rush current upon startup. Further, the on time of the main switch 6 is included in the off time of the rectifier switch 8 because a dead time is set for preventing through current when the switches are simultaneously turned on. Needless to say, these functions are control functions achieved by supplying a sufficient power supply voltage to the control circuit 4.

In the configuration of the charge pump 102 shown in FIG. 5, the output voltage VC is nearly twice the input voltage VIN. Thus an excessive power supply voltage may be supplied to the control circuit 4 in response to a high input. In order to adjust this voltage, it is recommendable to provide a voltage regulator circuit such as a series regulator as shown in, for example, FIG. 7.

Figure 7:
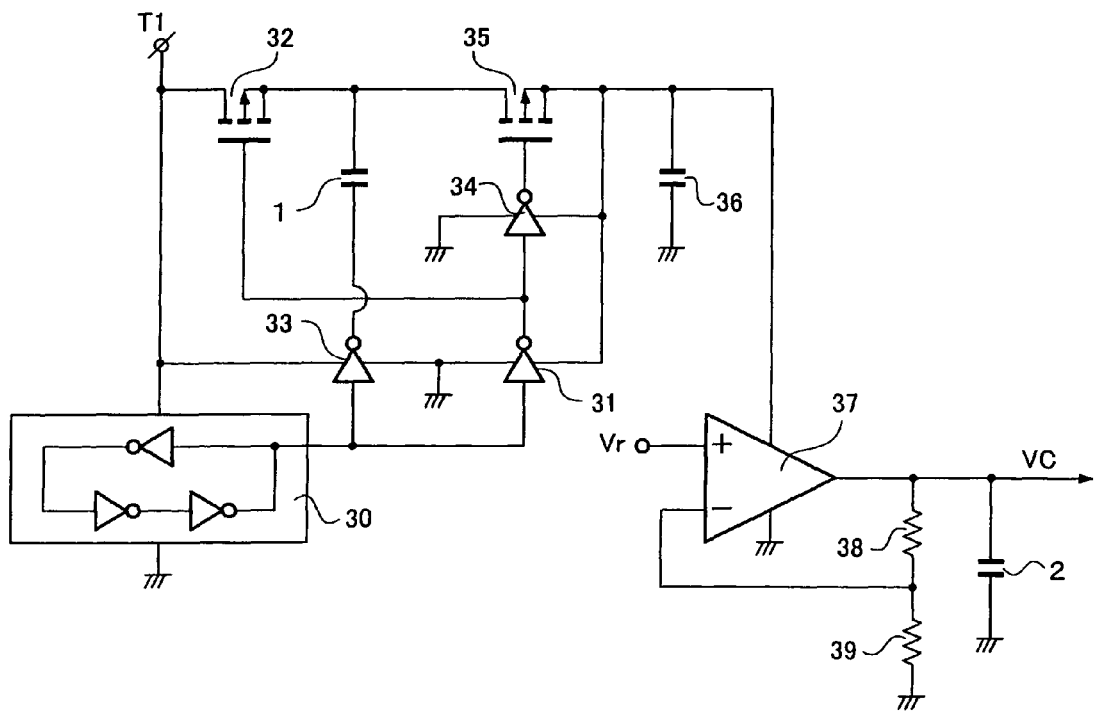
FIG. 7 is another structural diagram of the charge pump.

In FIG. 7, constituent elements from the ring oscillation circuit 30 to the second switch 35 are identical to those of FIG. 5. FIG. 7 is different from FIG. 5 in that a smoothing capacitor 36 for smoothing the output of the second switch 35, a power amplifier 37 supplied with power from the smoothing capacitor 36, and resistors 38 and 39 for dividing the output of the power amplifier 37 are provided. The divided voltage of the resistors 38 and 39 is applied to the inverting input terminal (−) of the power amplifier 37, a reference voltage Vr is applied to the non-inverting input terminal (+) of the power amplifier 37, and the output smoothing capacitor 2 is connected to the output of the power amplifier 37 to output the output voltage VC of the charge pump 102.

With this configuration, the power amplifier 37 controls the output voltage VC such that the divided voltage of the resistors 38 and 39 is equal to the reference voltage Vr. Thus the output voltage VC is stabilized at a predetermined voltage not larger than twice the input voltage VIN.

As described above, according to the switching power supply circuitry of Embodiment 3, the charge pump 102 operates upon startup to supply the control circuit 4 with a power supply voltage enabling a stable operation. Thus unlike the conventional configuration, it is possible to eliminate switching from "startup oscillation" to "main oscillation". Therefore, the circuitry can smoothly start without malfunctions.

Embodiment 4

Figure 8:
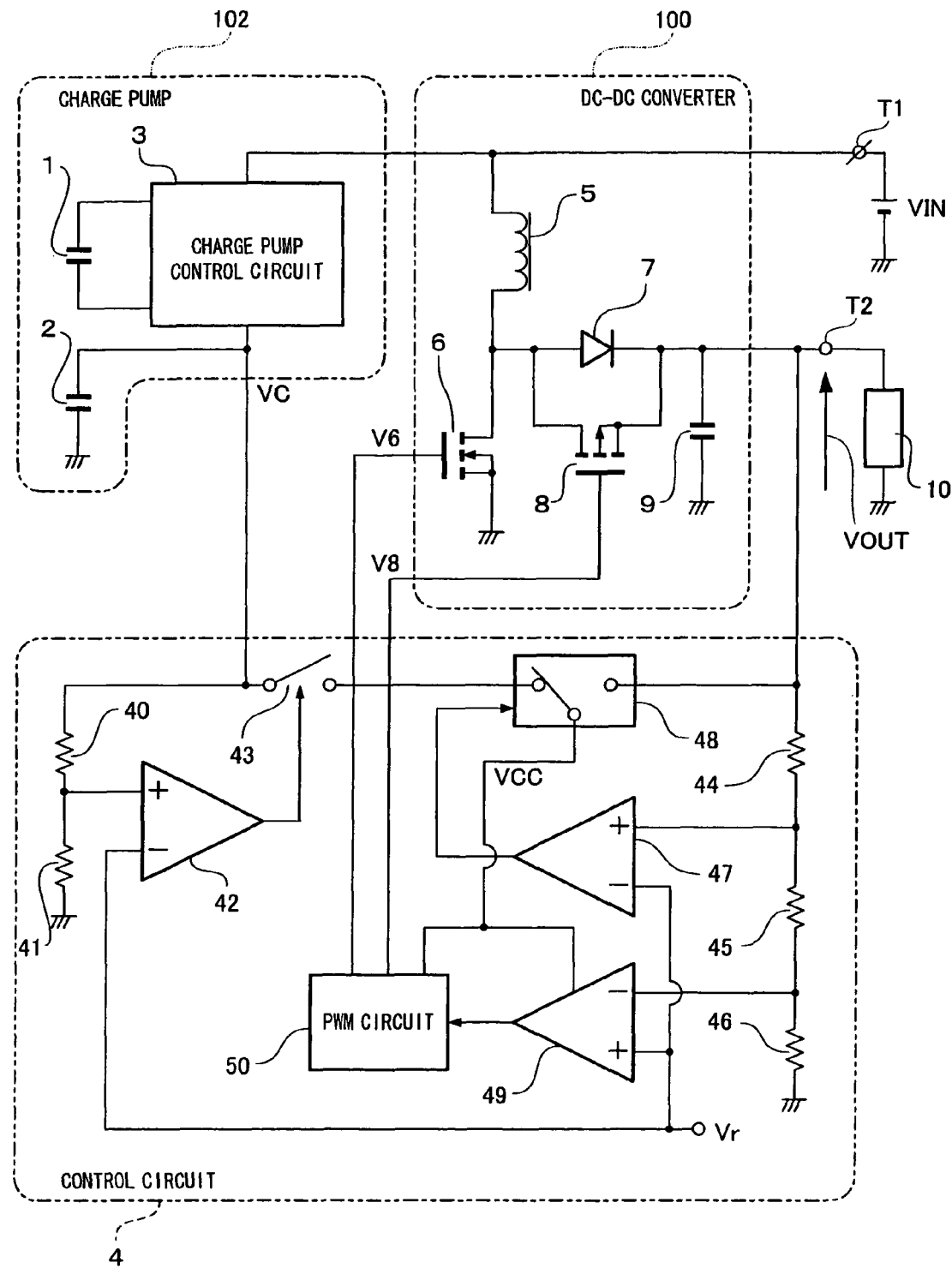
FIG. 8 is a structural diagram of switching power supply circuitry according to Embodiment 4 of the present invention.
Figure 9:
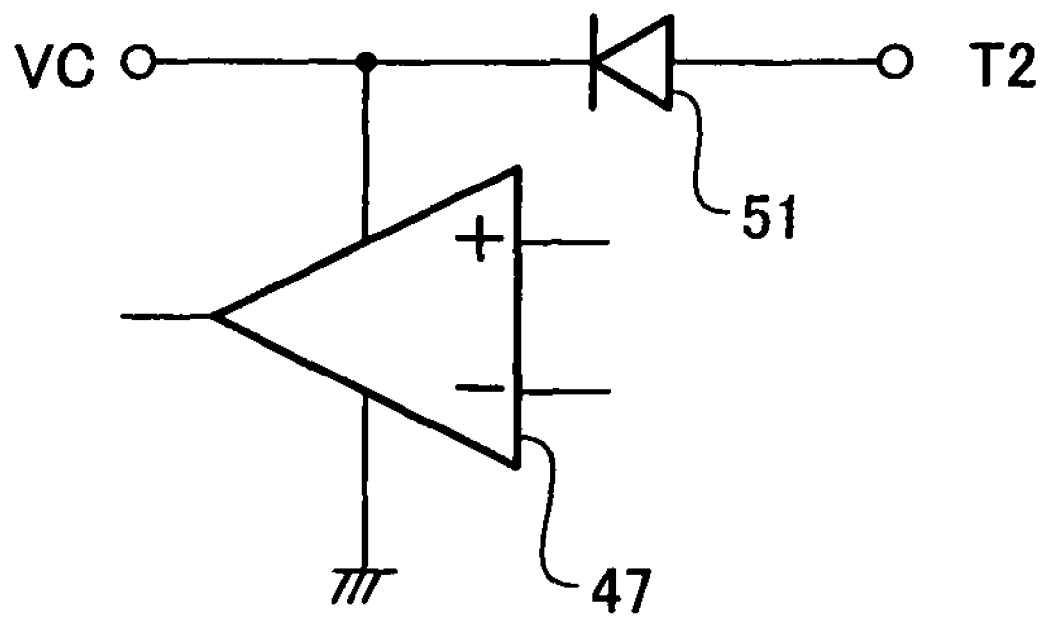
FIG. 9 is a circuit diagram showing power supply to a comparator 47 of Embodiment 4.

FIGS. 8 and 9 show switching power supply circuitry according to Embodiment 4 of the present invention.

In the switching power supply of Embodiment 3, the power supply voltage of the control circuit 4 is supplied from the charge pump, whereas in Embodiment 4, the power supply voltage of a control circuit 4 is supplied from an output voltage VOUT when the output voltage VOUT is sufficiently high.

In FIG. 8, constituent elements performing the same operations with the same configurations as those of the switching power supply circuitry of Embodiment 3 of FIG. 4 are indicated by the same reference numerals and the explanation thereof is omitted. The switching power supply circuitry of FIG. 8 is different from that of FIG. 4 in the configuration of the control circuit 4. FIG. 4 illustrates a block for outputting the driving pulses V6 and V8 to the main switch 6 and the rectifier switch 8, whereas FIG. 8 illustrates a more specific configuration, including additional functions.

The control circuit 4 includes resistors 40 and 41 for dividing an output voltage VC of a charge pump, a comparator 42 for comparing the voltage of the junction point of the resistors 40 and 41 with a reference voltage Vr, and a switch 43 switching in response to the output of the comparator 42. The control circuit 4 further includes resistors 44, 45 and 46 for dividing the output voltage VOUT, a comparator 47 for comparing the voltage of the junction point of the resistors 44 and 45 with the reference voltage Vr, and a switch circuit 48 switching in response to the output of the comparator 47. The switch circuit 48 is supplied with the output of the switch 43 and the output voltage VOUT. The switch circuit 48 selects the output of the switch 43 in response to the L-level output of the comparator 47, selects the output voltage VOUT in response to the H-level output of the comparator 47, and outputs the selected one of the output and the output voltage VOUT as a power supply voltage VCC in the control circuit. Moreover, the control circuit 4 includes an error amplifier 49 for comparing the voltage of the junction point of the resistors 45 and 46 with the reference voltage Vr and amplifying the voltage, and a pulse-width modulation (PWM) circuit 50 for generating driving pulses V6 and V8 having a pulse width corresponding to the output of the error amplifier 49. In Embodiment 4, the error amplifier 49 and the PWM circuit 50 are operated by power supplied from the power supply voltage VCC in the control circuit and the other comparators and switch circuits are operated by power supplied from the output VC of the charge pump.

The following will describe the startup operation of the switching power supply circuitry according to Embodiment 4 of the present invention.

The switching power supply circuitry of Embodiment 4 is also started by applying an input voltage VIN not lower than a predetermined voltage. First, since the output voltage VOUT is lower than the input voltage VIN, the voltage of the junction point of the resistors 44 and 45 is lower than the reference voltage Vr and the output of the comparator 47 is L level. Therefore, the switch circuit 48 selects the output of the switch 43 and outputs the output as the power supply voltage VCC in the control circuit. A charge pump 102 is operated by the input voltage VIN serving as a power supply voltage and charges an output smoothing capacitor 2. When the output voltage VC of the charge pump increases and reaches a power supply voltage enabling the control circuit 4 to stably operate, the voltage of the junction point of the resistors 40 and 41 exceeds the reference voltage Vr, the output of the comparator 42 reaches H level, and the switch 43 conducts. Thus the output voltage VC of the charge pump is applied to the switch circuit 48. Therefore, the power supply voltage is supplied to the error amplifier 49 and the PWM circuit 50 of the control circuit 4 at this point to start the operation of the switching power supply circuitry.

The PWM circuit 50 outputs the driving pulses V6 and V8 in response to the output of the error amplifier 49 for comparing the voltage of the junction point of the resistors 45 and 46 with the reference voltage Vr and amplifying the voltage. In response to the driving pulses, a main switch 6 and a rectifier switch 8 are alternately turned on/off, current passing through a choke coil 5 charges an output smoothing capacitor 9, and the output voltage VOUT starts increasing.

When the output voltage VOUT increases and the voltage of the junction point of the resistors 44 and 45 exceeds the reference voltage Vr, the output of the comparator 47 reaches H level and the switch circuit 48 selects the output voltage VOUT and outputs the voltage as the power supply voltage VCC in the control circuit. Therefore, the error amplifier 49 and the PWM circuit 50 with large current consumption are supplied with power from the output voltage VOUT through the control circuit 4, reducing the load of power supply in the charge pump 102.

Further, when the output voltage VOUT increases and the voltage of the junction point of the resistors 45 and 46 reaches the reference voltage Vr, the PWM circuit 50 adjusts the pulse widths of the driving pulses V6 and V8 in response to the output of the error amplifier 49. As a result, the output voltage VOUT is controlled and stabilized such that the voltage of the junction point of the resistors 45 and 46 is equal to the reference voltage Vr.

The switching power supply circuitry can be smoothly started without causing malfunctions and power consumed in the control circuit 4 is mostly supplied from the output voltage VOUT after startup, thereby reducing the load of power supply in the charge pump 102. Therefore, the charge pump 102 can be miniaturized on thermal design.

In Embodiment 4, the charge pump 102 operates all the time, though the load of power supply in the charge pump 102 is reduced. The present invention is not limited to this configuration and operation. Although the comparator 42, the switch 43, the comparator 47, the switch circuit 48 and so on are supposed to be supplied with power from the output VC of the charge pump, the power may be supplied from the output voltage VC of the charge pump when the output of the comparator 47 is L level and may be supplied from the output voltage VOUT when the output of the comparator 47 is H level. With this configuration, power can be supplied to the control circuit 4 only from the output voltage VOUT after startup. Thus power consumption can be further reduced by stopping the charge pump 102 after startup. To be specific, as shown in FIG. 9, a diode 51 is added for, for example, the comparator 47, so that even when the charge pump 102 is stopped and the output voltage VC of the charge pump 102 is not supplied, power is supplied from the output voltage VOUT through the diode 51.

Embodiment 5

Figure 10:
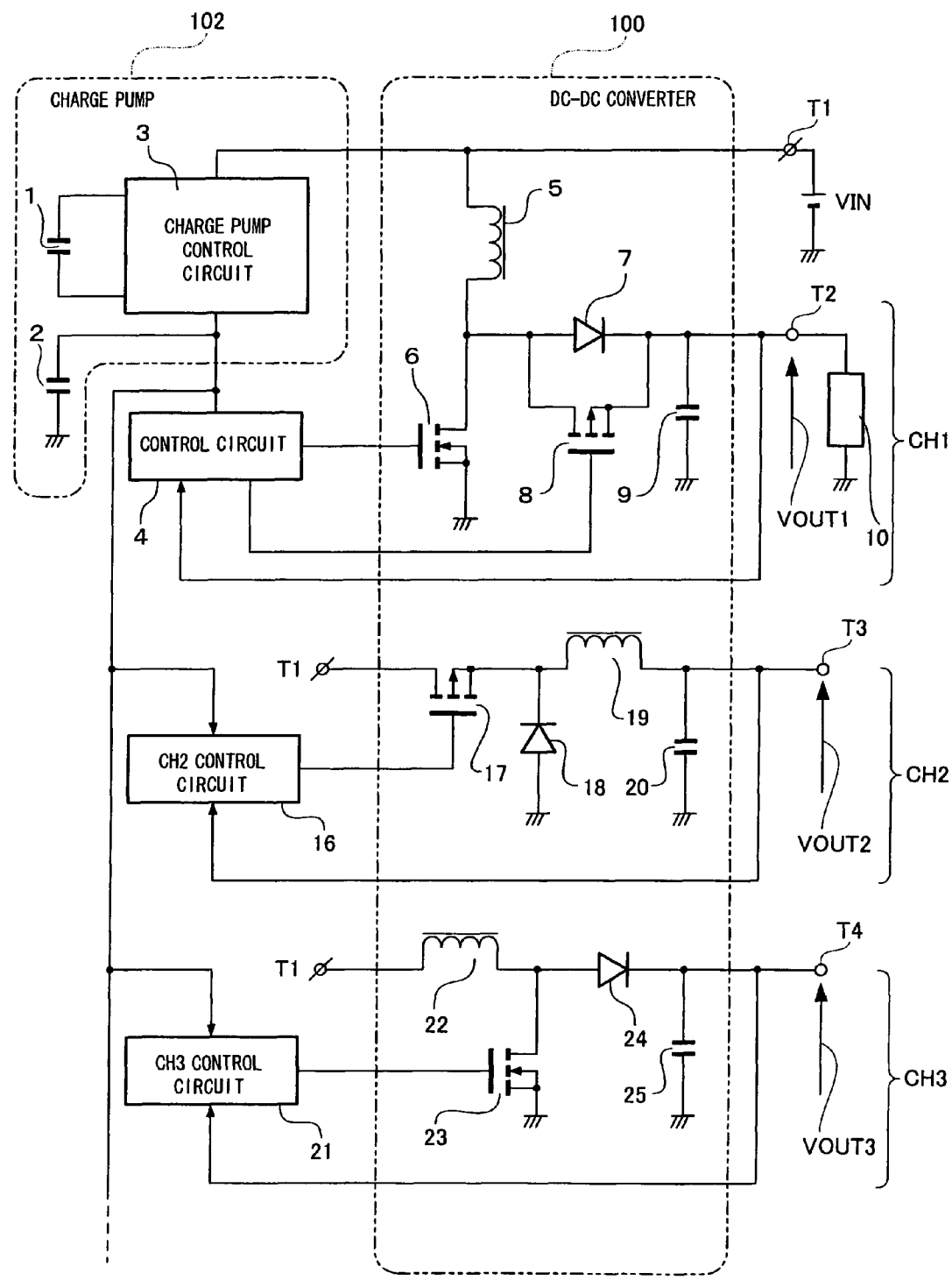
FIG. 10 is a structural diagram of switching power supply circuitry according to Embodiment 5 of the present invention.
Figure 11:
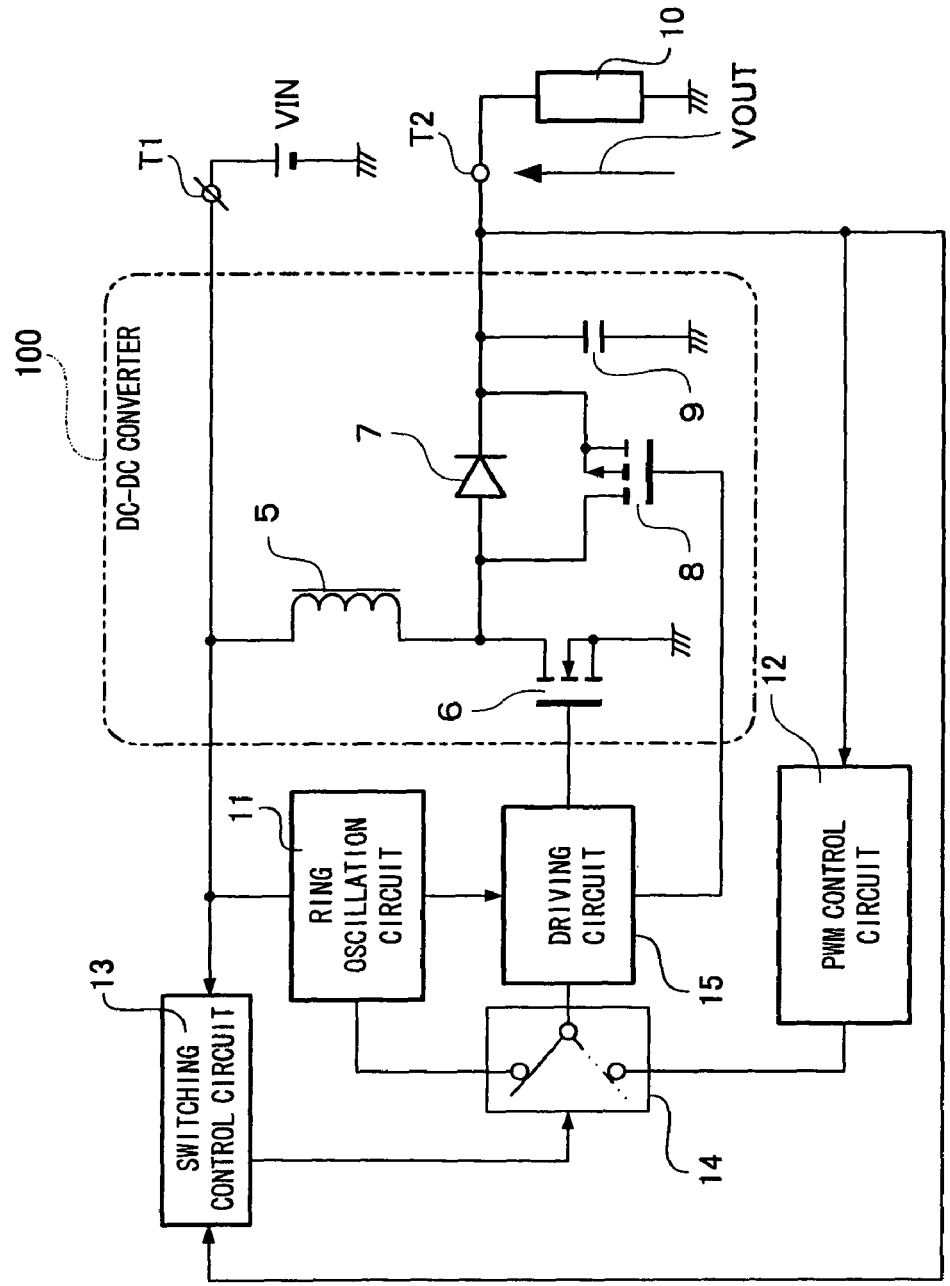
FIG. 11 is a structural diagram of conventional switching power supply circuitry.

FIG. 10 shows switching power supply circuitry according to Embodiment 5 of the present invention.

The switching power supply circuitry is configured such that a plurality of output voltages VOUT1 to VOUT3, . . . are outputted from an input voltage VIN through a DC-DC converter. FIG. 10 shows a multi-channel control switching power supply including a circuit for outputting the output voltage VOUT1, a circuit for outputting the output voltage VOUT2, and a circuit for outputting the output voltage VOUT3.

A charge pump, the DC-DC converter f or generating the output voltage VOUT1, and a control circuit 4 in FIG. 10 are similar in configuration and operation to Embodiment 3 of FIG. 4 and thus the detailed explanation thereof is omitted. CH2 is made up of a CH2 control circuit 16 and a step-down converter including a main switch 17, a rectifier diode 18, a choke coil 19, and an output smoothing capacitor 20. CH3 is made up of a CH3 control circuit 21 and a step-up converter including a choke coil 22, a main switch 23, a rectifier diode 24, and an output smoothing capacitor 25. Like the control circuit 4, the CH2 control circuit 16 and the CH3 control circuit 21 are supplied with power from an output voltage VC of the charge pump.

In the switching power supply circuitry of Embodiment 5, the same operations as Embodiment 3 are performed from the supply of an input voltage VIN to the start of a charge pump control circuit 3. The output voltage VC of the charge pump is monitored by the control circuit (for example, the control circuit 4, the CH2 control circuit 16, and the CH3 control circuit 21) of each CH. When each control circuit recognizes that the output voltage VC enables a stable operation, each control circuit outputs a driving pulse to each main switch. In a step-up converter like CH1 and CH3, current passes from the input voltage VIN through the choke coils 5 and 22 in response to the on/off of main switches 6 and 23 and charges the output smoothing capacitors 9 and 25 from the rectifier switch 8 and the rectifier diode 24. Also in a step-down converter like CH2, current passes through the choke coil 19 in response to the on/off of the main switch 17 and charges the output smoothing capacitor 20. When each output voltage (for example, the output voltages VOUT1, VOUT2 and VOUT3) increases thus and rises to a desired voltage necessary for electronic equipment or an electronic circuit which serves as a load 10, the voltage is controlled to be stabilized at the desired voltage.

According to the switching power supply circuitry of Embodiment 5, the output voltage VC of the charge pump 102 is supplied as a power supply voltage to the control circuit of each channel. It is thus possible to eliminate switching from startup oscillation to main oscillation upon startup of the conventional configuration. Therefore, it is possible to achieve smooth startup without causing malfunctions and remove restrictions on the order of start in the multi-channel configuration. At this point, input rush current, output overshoot and so on upon startup can be suppressed by a control function such as soft start to reduce excessive power consumption, increasing the life of a battery as in Embodiment 3.

In the foregoing embodiments, the charge pump 102 of FIG. 5 is made up of the ring oscillation circuit 30 acting as an oscillation circuit for generating driving pulses of a predetermined frequency, the first and second switches 32 and 35 switching in response to the driving pulses, and the single jumping capacitor 1 charged and discharged by the switching of the first and second switches 32 and 35. The single jumping capacitor 1 is charged up to the input voltage VIN and the voltage of the jumping capacitor 1 is added to the input voltage VIN and outputted, so that the output voltage VC of the charge pump 102 is twice the input voltage VIN. By providing a plurality of switch elements switching in response to the driving pulses and a plurality of jumping capacitors charged and discharged by the switching of the plurality of switch elements, the output voltage VC of the charge pump 102 can be changed. To be specific, two jumping capacitors having an equal capacitance are provided. The two jumping capacitors are connected in series and charged up to the input voltage VIN, and then the two jumping capacitors are connected in parallel. By adding the voltage of the jumping capacitors to the input voltage VIN and outputting the voltage, a voltage 1.5 times as large as the input voltage VIN can be obtained as the output voltage VC of the charge pump 102. In the charge pump 102, the plurality of jumping capacitors are connected in series or parallel and charged/discharged, so that any given voltage value can be theoretically outputted as the input voltage VIN.

The switching power supply circuitry of the present invention is useful for electronic equipment using a low-voltage battery.

What is claimed is:

1. A switching power supply circuit, comprising:
    a step-up converter for boosting a DC input voltage to obtain a first boosted voltage and supplying the first boosted voltage to a load;
    a charge pump for boosting the DC input voltage without using a voltage based on the first boosted voltage to obtain a second boosted voltage; and
    a control circuit supplied with power at the second boosted voltage from the charge pump, the control circuit for controlling the step-up converter.

2. The switching power supply circuit according to claim 1, wherein the step-up converter comprises a switch element for performing switching to generate the first boosted voltage.

3. The switching power supply circuit according to claim 2, wherein the control circuit is for controlling a switching operation of the switch element.

4. The switching power supply circuit according to claim 2, wherein the control circuit controls a switching operation of the switch element of the step-up converter when the second boosted voltage from the charge pump is equal to or higher than a predetermined operation start voltage.

5. The switching power supply circuit according to claim 1, wherein the charge pump comprises:
   an oscillation circuit for generating driving pulses of a predetermined frequency;
   a plurality of second switch elements for performing switching in response to the driving pulses; and
   a jumping capacitor for being charged or discharged by switching of the second switch elements.

6. The switching power supply circuit according to claim 5, wherein the oscillation circuit is a ring oscillation circuit including inverters of multiple stages connected like a ring.

7. The switching power supply circuit according to claim 5, wherein the charge pump comprises a stabilizing circuit for stabilizing the second boosted voltage.

8. The switching power supply circuit according to claim 7, wherein the stabilizing circuit is a series regulator.

9. The switching power supply circuit according to claim 3, wherein the control circuit comprises:
   an error amplifier for comparing the first boosted voltage of the step-up converter with a target value and for generating an error signal; and
   a PWM circuit for generating a driving pulse for controlling the switching operation of the switching element of the step-up converter in response to the error signal, so that when the first boosted voltage of the step-up converter is equal to or higher than a predetermined value, at least one of the error amplifier and the PWM circuit is supplied with power from the first boosted voltage of the step-up converter, not from the second boosted voltage of the charge pump.

10. The switching power supply circuit according to claim 1, wherein when the first boosted voltage of the step-up converter is equal to or higher than a predetermined value, the control circuit is for being supplied with power from the first boosted voltage of the step-up converter, not from the second boosted voltage of the charge pump.

11. The switching power supply circuit according to claim 1, wherein the charge pump is for stopping operation when the first boosted voltage of the step-up converter is equal to or higher than a predetermined value.

12. The switching power supply circuit according to claim 1, further comprising:
   a DC-to-DC converter for obtaining an output voltage from the DC input voltage; and
   a second control circuit is for being supplied with power at the second boosted voltage from the charge pump and for controlling the DC-to-DC converter when the second boosted voltage from the charge pump reaches a predetermined operation start voltage.

* * * * *